United States Patent
Champoux

(10) Patent No.: US 10,884,847 B1
(45) Date of Patent: Jan. 5, 2021

(54) FAST PARALLEL CRC DETERMINATION TO SUPPORT SSD TESTING

(71) Applicant: Advantest Corporation, Tokyo (JP)

(72) Inventor: Duane Champoux, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 16/545,986

(22) Filed: Aug. 20, 2019

(51) Int. Cl.
  *G06F 11/10* (2006.01)
  *G11C 29/08* (2006.01)
  (Continued)

(52) U.S. Cl.
  CPC ........ *G06F 11/1004* (2013.01); *G06F 3/0619* (2013.01); *G06F 3/0653* (2013.01); *G06F 3/0679* (2013.01); *G06F 7/584* (2013.01); *G11C 19/28* (2013.01); *G11C 29/08* (2013.01); *G11C 29/56* (2013.01)

(58) Field of Classification Search
  None
  See application file for complete search history.

(56) References Cited

U.S. PATENT DOCUMENTS 5,497,378 A 3/1996 Amini et al.
5,805,571 A 9/1998 Zwan et al.
(Continued)

FOREIGN PATENT DOCUMENTS

CN 101120262 2/2008
CN 101313366 11/2008
(Continued)

OTHER PUBLICATIONS

FPGA Wikipedia Entry (http://en.wikipedia.orglwiki/Field-programmable_gate_array).
(Continued)

*Primary Examiner* — Phung M Chung

(57) ABSTRACT

Fast parallel CRC determination to support SSD testing includes a test data pattern generator for generating test data for storage onto a memory storage device under test (DUT), wherein the generator is operable to generate, every clock cycle, a respective N bit word comprising a plurality of M bit subwords, a digest circuit operable to employ a digest function on each N bit word to produce, every clock cycle, a respective word digest for each N bit word, and a storage circuit operable to store each N bit word along with an associated word digest to the DUT. The digest circuit includes a plurality of first circuits each operable to perform a first digest function on a respective subword of the plurality of subwords, in parallel, to produce a plurality of subword digests, a plurality of second circuits each operable to perform a second digest function on a respective subword digest of the plurality of subword digests, the second digest function being equivalent to shifting the respective subword digest through a linear feedback shift register (LFSR) then followed by (I×M) zero bits, wherein I is related to a word position, within the N bit word, of a respective subword that generated the respective subword digest, and an XOR circuit operable to XOR outputs of the plurality of second circuits together along with a shifted prior LFSR state to produce the word digest of the N bit word.

20 Claims, 8 Drawing Sheets

(51) Int. Cl.
| | |
|---|---|
| G01R 31/3177 | (2006.01) |
| G01R 31/14 | (2006.01) |
| G01R 31/28 | (2006.01) |
| G01R 31/3183 | (2006.01) |
| G01R 31/319 | (2006.01) |
| G06F 11/26 | (2006.01) |
| G06F 11/273 | (2006.01) |
| G11C 29/56 | (2006.01) |
| G06F 7/58 | (2006.01) |
| G06F 3/06 | (2006.01) |
| G11C 19/28 | (2006.01) |

(56) References Cited

U.S. PATENT DOCUMENTS

| | | |
|---|---|---|
| 6,026,230 A | 2/2000 | Lin et al. |
| 6,069,873 A | 5/2000 | Pugaczewski et al. |
| 6,357,023 B1 | 3/2002 | Co et al. |
| 6,681,351 B1 | 1/2004 | Kittross et al. |
| 6,904,375 B1 | 6/2005 | Sabih et al. |
| 7,181,360 B1 | 2/2007 | Nikolac et al. |
| 7,269,805 B1 | 9/2007 | Ansari et al. |
| 7,343,558 B2 | 3/2008 | Kadota |
| 7,363,188 B1 | 4/2008 | Olgaard et al. |
| 7,555,589 B2 | 6/2009 | Kang |
| 7,590,903 B2 | 9/2009 | Volkerink et al. |
| 7,707,468 B2 | 4/2010 | Volkerink et al. |
| 7,772,828 B2 | 8/2010 | Jang et al. |
| 8,127,187 B2 | 2/2012 | Xia et al. |
| 8,161,402 B1 | 4/2012 | Edson et al. |
| 8,269,520 B2 | 9/2012 | Conner |
| 8,545,248 B2 | 10/2013 | Davey et al. |
| 8,564,297 B2 | 10/2013 | Burns et al. |
| 8,581,614 B2 | 11/2013 | Co et al. |
| 8,660,424 B2 | 2/2014 | Achkir et al. |
| 8,718,967 B2 * | 5/2014 | Filler ................... G06F 17/00 702/119 |
| 8,842,480 B2 | 9/2014 | Ellis et al. |
| 8,850,267 B2 | 9/2014 | Aggarwal et al. |
| 9,230,046 B2 * | 1/2016 | Asaad ................... G06F 30/331 |
| 9,610,729 B2 * | 4/2017 | Sieben ................... B29C 66/41 |
| 9,952,276 B2 | 4/2018 | Frediani et al. |
| 9,989,591 B2 | 6/2018 | Ge et al. |
| 2002/0007025 A1 | 1/2002 | Crowther et al. |
| 2002/0055834 A1 | 5/2002 | Andrade et al. |
| 2002/0163351 A1 | 11/2002 | Koh et al. |
| 2002/0184326 A1 | 12/2002 | Thomson |
| 2003/0191590 A1 | 10/2003 | Narayan et al. |
| 2003/0231741 A1 | 12/2003 | Rancu et al. |
| 2004/0000922 A1 | 1/2004 | Witte |
| 2004/0015739 A1 | 1/2004 | Heinkel et al. |
| 2004/0059536 A1 | 3/2004 | Chang et al. |
| 2004/0168111 A1 | 8/2004 | Arnold et al. |
| 2004/0225465 A1 | 11/2004 | Pramanick et al. |
| 2005/0022088 A1 | 1/2005 | Nakayama |
| 2005/0154550 A1 | 7/2005 | Singh et al. |
| 2005/0159050 A1 | 7/2005 | Hama et al. |
| 2005/0256969 A1 | 11/2005 | Yancey et al. |
| 2005/0262414 A1 | 11/2005 | Elston et al. |
| 2005/0273685 A1 | 12/2005 | Sachdev et al. |
| 2005/0278682 A1 | 12/2005 | Dowling |
| 2006/0170435 A1 | 8/2006 | Granicher et al. |
| 2006/0195744 A1 | 8/2006 | Petersen |
| 2007/0168808 A1 | 7/2007 | Ong |
| 2007/0220380 A1 | 9/2007 | Ohanyan |
| 2007/0266288 A1 | 11/2007 | Volkerink et al. |
| 2007/0271059 A1 | 11/2007 | Vonstaudt |
| 2007/0282556 A1 | 12/2007 | Achkar et al. |
| 2008/0015798 A1 | 1/2008 | Bullock et al. |
| 2008/0126899 A1 | 5/2008 | Brennan et al. |
| 2008/0189060 A1 | 8/2008 | Zellner et al. |
| 2008/0204066 A1 | 8/2008 | Jang et al. |
| 2008/0285571 A1 | 11/2008 | Arulambalam et al. |
| 2009/0100304 A1 | 4/2009 | Li et al. |
| 2009/0112548 A1 | 4/2009 | Conner |
| 2009/0113245 A1 | 4/2009 | Conner |
| 2009/0172480 A1 | 7/2009 | Jeddeloh |
| 2009/0212799 A1 | 8/2009 | de la Puente et al. |
| 2010/0157854 A1 | 6/2010 | Anderson et al. |
| 2010/0190451 A1 | 7/2010 | Huber et al. |
| 2010/0312517 A1 | 12/2010 | McNamara et al. |
| 2010/0313071 A1 | 12/2010 | Conner |
| 2011/0050268 A1 | 3/2011 | Co et al. |
| 2011/0072307 A1 | 3/2011 | Hatley et al. |
| 2011/0078525 A1 | 3/2011 | Xia et al. |
| 2011/0099424 A1 | 4/2011 | Rivera Trevino et al. |
| 2011/0103235 A1 | 5/2011 | Luong et al. |
| 2011/0112790 A1 | 5/2011 | Lavie et al. |
| 2011/0248737 A1 | 10/2011 | Takeshita et al. |
| 2011/0276302 A1 | 11/2011 | Rivoir |
| 2011/0298486 A1 | 12/2011 | Co et al. |
| 2012/0191402 A1 | 7/2012 | Filler et al. |
| 2013/0013969 A1 | 1/2013 | Rajarao et al. |
| 2013/0015873 A1 | 1/2013 | Suzuki et al. |
| 2013/0080503 A1 | 3/2013 | Dean et al. |
| 2014/0207402 A1 | 7/2014 | Ferry |
| 2014/0236524 A1 | 8/2014 | Frediani et al. |
| 2014/0236526 A1 | 8/2014 | Frediani et al. |
| 2014/0236527 A1 | 8/2014 | Chan et al. |
| 2014/0237292 A1 | 8/2014 | Chan |
| 2014/0244204 A1 | 8/2014 | Frediani |
| 2015/0028908 A1 | 1/2015 | Kushnick et al. |
| 2015/0253387 A1 | 9/2015 | Gahoi et al. |
| 2020/0200819 A1 * | 6/2020 | Malisic ............ G01R 31/2834 |

FOREIGN PATENT DOCUMENTS

| | | |
|---|---|---|
| CN | 201434049 | 3/2010 |
| CN | 102341717 | 2/2012 |
| CN | 106338679 A | 1/2017 |
| CN | 106569481 A | 4/2017 |
| CN | 106597184 A | 4/2017 |
| EP | 0651261 | 5/1995 |
| KR | 100778459 | 11/2007 |
| KR | 20090015895 | 2/2009 |
| KR | 20090041528 | 4/2009 |
| KR | 20100073662 | 7/2010 |
| KR | 1020100120692 | 11/2010 |
| KR | 101028594 | 4/2011 |
| KR | 101111482 | 2/2012 |
| KR | 2010062387 | 3/2012 |
| TW | 583534 B | 4/2004 |
| TW | 200900715 A | 1/2009 |
| TW | 200817698 A | 11/2010 |
| TW | I363879 B | 5/2012 |
| TW | 201433802 A | 9/2014 |
| TW | 201837490 A | 10/2018 |
| WO | 2011149725 A2 | 12/2011 |
| WO | 20111150409 | 12/2011 |
| WO | 2012070076 | 5/2012 |
| WO | 20120126087 A1 | 9/2012 |

OTHER PUBLICATIONS

International Search Report; International Application No. PCTIUS2013/049118; dated Jan. 22, 2014.
Merriam Webster Online Dictionary Definition of "Protocol".
Campobello et al., "Parallel CRC Realization" (Journal) Oct. 2003, 8 pages, vol. 52., No. 10. IEEE Computer Society; Washington, DC.
Alnajjar et al., "A Comprehensive Guide for CRC Hardware Implementation" 4 pages; IDEA! Electronic Systems; Sao Paulo, Brazil.
Stavinov. "A Practical Parallel CRC Generation Method" (Article) Jan. 2010; Issue 234; Circuit Cellular.
Penokie. "End-to-End Data Protection" (Serial) Oct. 22, 2003. T10/03-176 revision 9.

* cited by examiner

FAST PARALLEL CRC DETERMINATION TO SUPPORT SSD TESTING

RELATED APPLICATION(S)

This application is related to U.S. patent application Ser. No. 13/773,569, filed Feb. 11, 2013, entitled "Test Architecture Having Multiple FPGA Based Hardware Accelerator Blocks for Testing Multiple DUTs Independently," to Chan et al., which is hereby incorporated by reference herein in its entirety for all purposes.

FIELD OF INVENTION

Embodiments of the present invention generally relate to the field of electronic device testing systems, and more specifically to fast parallel CRC determination to support SSD testing.

BACKGROUND

Test environments for sold state drives (SSDs) generally process data blocks to and from the SSD in standard "block" or "sector" sizes of, for example, 256, 512, or 4096 bytes. Conventionally, the block or sector of transmitted data (e.g., data read from an SSD) contained mostly, if not always, data. For example, each byte of read data received from an SSD was generally stored data.

However, new trends of storage, including "cloud" storage, often involving internet and/or wireless transmission, have introduced new considerations to data formats. For example, in order to increase data integrity, various forms of metadata, protection data, e.g., data rights, error correction data, and the like are being included in data transfers, e.g., read and write operations, to and from SSDs. Such additional information or "overhead" is included in transmissions to and from and SSD, in addition the actual data content that is stored by the SSD.

The metadata generally includes a cyclic redundancy check (CRC) to detect and/or correct errors in the data. Testing of sector-based storage devices, e.g., SSDs, generally requires computation of CRCs. For example, when reading a sector from a device like an SSD, an Automated Test Environment (ATE) system will read a sector of data, including metadata, and compute a CRC value for the data. The ATE will then compare the computed CRC value to the CRC value included in the read metadata.

Unfortunately, conventional systems and methods of determining CRCs are undesirably slow.

SUMMARY OF THE INVENTION

It would be valuable and desirable for an SSD ATE system to operate at the maximum transfer rate of an SSD during testing.

Therefore, what is needed are systems and methods for fast parallel CRC determination to support SSD testing. What is additionally needed are systems and methods for fast parallel CRC determination to support SSD testing that generate a CRC value for a 256-bit input packet in one clock cycle. What is further needed are systems and methods for fast parallel CRC determination to support SSD testing that are compatible and complementary with existing systems and methods of automated test environment. Embodiments of the present invention provide these advantages and enhance the user's experience.

In accordance with an embodiment of the present invention, a system used for testing memory storage devices includes a test data pattern generator for generating test data for storage onto a memory storage device under test (DUT), wherein the generator is operable to generate, every clock cycle, a respective N bit word comprising a plurality of M bit subwords, a digest circuit operable to employ a digest function on each N bit word to produce, every clock cycle, a respective word digest for each N bit word, and a storage circuit operable to store each N bit word along with an associated word digest to the DUT. The digest circuit includes a plurality of first circuits each operable to perform a first digest function on a respective subword of the plurality of subwords, in parallel, to produce a plurality of subword digests, a plurality of second circuits each operable to perform a second digest function on a respective subword digest of the plurality of subword digests, the second digest function being equivalent to shifting the respective subword digest through a linear feedback shift register (LFSR) then followed by (I×M) zero bits, wherein I is related to a word position, within the N bit word, of a respective subword that generated the respective subword digest, and an XOR circuit operable to XOR outputs of the plurality of second circuits together along with a shifted prior LFSR state to produce the word digest of the N bit word.

In accordance with another embodiment of the present invention, an automated test environment (ATE) system used for testing solid state drives (SSDs) includes a test data pattern generator for generating test data at a rate of at least 8 gigabytes (GB) per second for storage onto an SSD under test (DUT), wherein the test data comprises a respective N bit word generated every clock cycle and comprising a plurality of 8 subwords, a pipelined digest circuit operable to employ a digest function on each N bit word to produce a respective word digest value for each N bit word every clock cycle, and a storage circuit operable to store each N bit word along with an associated word digest value to the DUT. The pipelined digest circuit includes a plurality of first circuits each operable to perform a first digest function on a respective subword of the plurality of subwords, in parallel, to produce a plurality of subword digests wherein each first circuit operates within a first clock cycle and performs a function that is equivalent to shifting a respective subword through an LFSR having zero start state, a plurality of second circuits each operable, within a second clock cycle, to perform a second digest function on a respective subword digest of the plurality of subword digests, the second digest function being equivalent to shifting the respective subword digest through the LFSR then followed by (I×M) zero bits, wherein I is related to a word position, within the N bit word, of a respective subword that generated the respective subword digest, and an XOR circuit operable to XOR outputs of the plurality of second circuits together along with a shifted prior LFSR state to produce the word digest of the N bit data word.

In accordance with a method embodiment according to the present invention, a method of testing memory storage devices includes generating test data for storage onto a memory storage device under test (DUT) using a test data pattern generator, wherein the generating produces a respective N bit word every clock cycle and wherein the N bit word comprises a plurality of subwords, performing a digest function on each N bit word to produce, every clock cycle, a respective word digest for each N bit word using a digest circuit, and storing each N bit word along with an associated word digest to the DUT using a storage circuit. The digest circuit operates by using a plurality of first circuits each to perform a first digest function on a respective subword of the plurality of subwords, in parallel, to produce a plurality of subword digests wherein each first circuit operates within a single clock cycle to perform a function that is equivalent to shifting a respective subword through a linear feedback shift register (LFSR) having zero start state, using a plurality of second circuits, within a single clock cycle, to each perform a second digest function on a respective subword digest of the plurality of subword digests, the second digest function being equivalent to shifting the respective subword digest through the LFSR then followed by (I×M) zero bits, wherein I is related to a word position, within the N bit word, of a respective subword that generated the respective subword digest, and XORing outputs of the plurality of second circuits together along with a shifted prior LFSR state to produce the word digest of the N bit data word. The method further includes reading an N bit word and associated word digest from the DUT, verifying that the N bit word is accurately stored on the DUT by analyzing the N bit word and the associated word digest, and recording a result of the verifying.

BRIEF DESCRIPTION OF THE DRAWINGS

The accompanying drawings, which are incorporated in and form an integral part of this specification, illustrate embodiments of the invention and, together with the description, serve to explain the principles of the invention. Unless otherwise noted, the drawings are not drawn to scale.

DETAILED DESCRIPTION

Figure 1:
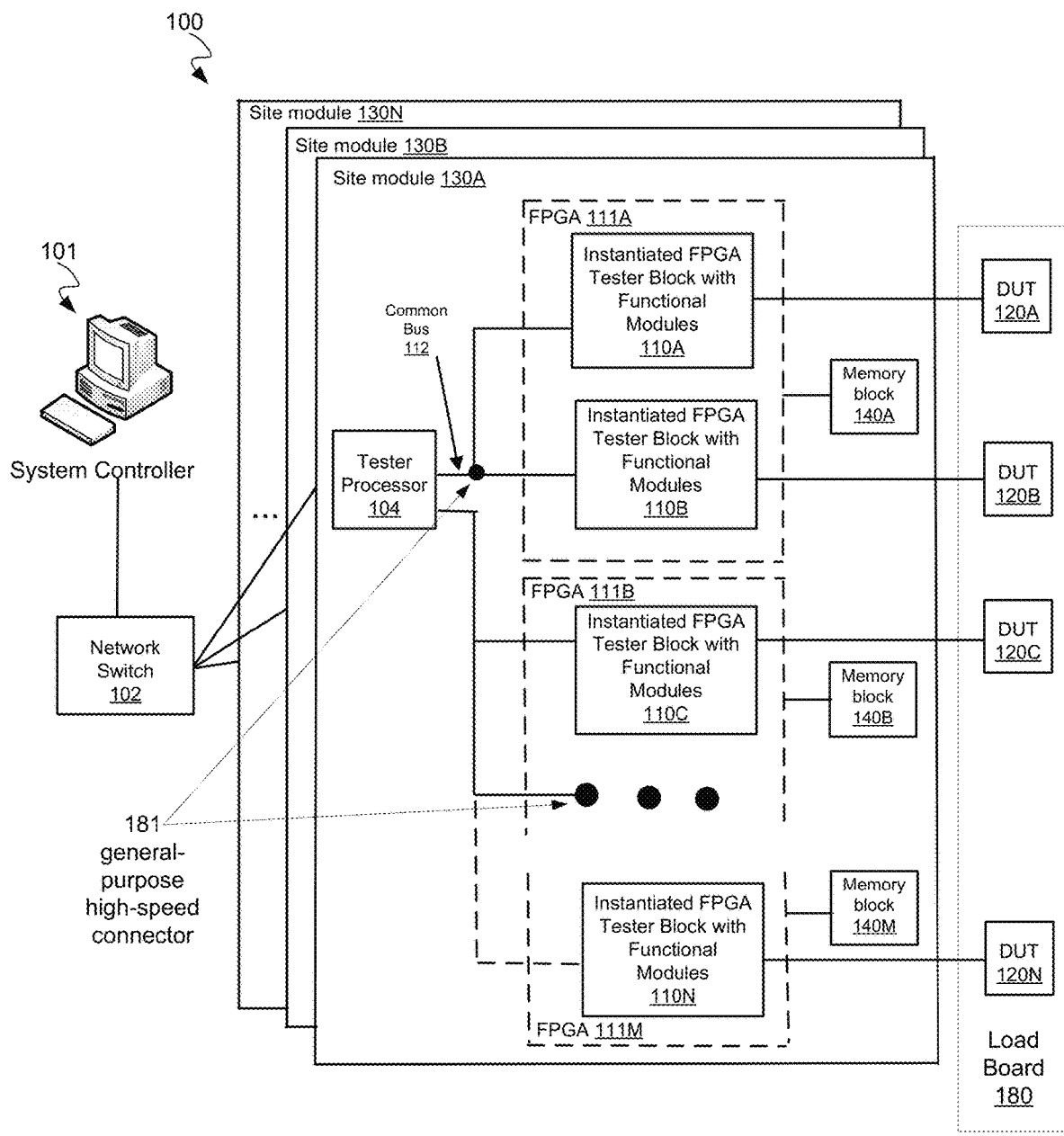
FIG. 1 illustrates an exemplary block diagram of an exemplary electronic test system, which may be used as a platform to implement embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions which follow (e.g., methods 400, 500, 700) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "capturing" or "storing" or "reading" or "analyzing" or "generating" or "resolving" or "accepting" or "selecting" or "determining" or "displaying" or "presenting" or "computing" or "sending" or "receiving" or "reducing" or "detecting" or "setting" or "accessing" or "placing" or "testing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or "XORing" or "verifying" or "recording" or the like, may refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in In re Nuijten, 500 F.3d 1346, 1356-57 (Fed. Cir. 1007). The use of this term is to be understood to remove only propagating transitory signals per se from the claim scope and does not relinquish rights to all standard computer-readable media that are not only propagating transitory signals per se.

Fast Parallel CRC Determination to Support SSD Testing

FIG. 1 illustrates an exemplary block diagram of an exemplary electronic test system 100, which may be used as a platform to implement embodiments of the present invention. System 100 may also be known as, or referred to as, Automatic Test Equipment or as an Automated Test Environment (ATE). In one embodiment, ATE apparatus 100 may be implemented within any testing system capable of testing multiple DUTs simultaneously. Devices to be tested may include, for example, integrated circuits, circuit boards comprising a myriad of integrated circuits and other electronic components, rotating magnetic media devices ("hard disk drives"), solid state drives ("SSDs"), and the like.

Referring to FIG. 1, an ATE apparatus 100 for testing devices, in accordance with an embodiment of the present invention includes a system controller 101, a network switch 102 coupling the system controller to the site module boards 130A-130N, FPGA devices 111A-111M comprising instantiated FPGA tester blocks 110A-110N, memory block modules 140A-140M wherein each of the memory blocks 140A-140M is coupled to one of the FPGA devices 111A-111M, and the devices under test (DUTs) 120A-120N, wherein each device under test 120A-120N is coupled to one of the instantiated FPGA tester blocks 110A-110N.

In one embodiment, the system controller 101 may be a computer system, e.g., a personal computer (PC) that provides a user interface for the user of the ATE to load the test programs and run tests for the DUTs coupled to the ATE 100. The Verigy Stylus™ Operating System is one example of test software often used during device testing. It provides the user with a graphical user interface from which to configure and control the tests. It can also comprise functionality to control the test flow, control the status of the test program, determine which test program is running, and log test results and other data related to test flow. In one embodiment, the system controller can be coupled to and control as many as 512 DUTs.

In one embodiment, the system controller 101 can be coupled to the site module boards 130A-130N through a network switch, such as an Ethernet switch. In other embodiments, the network switch may be compatible with a different protocol such as Fibre Channel, 802.11, ATM and/or PCIe, for instance.

In one embodiment, each of the site module boards 130A-130N may be a separate standalone board used for purposes of evaluation and development that attaches to custom-built load board fixtures, e.g., load board 180, on which the DUTs 120A-120N are loaded, and also to the system controller 101 from where the test programs are received. In other embodiments, the site module boards may be implemented as plug-in expansion cards or as daughter boards that plug into the chassis of the system controller 101 directly.

The site module boards 130A-130N can each comprise at least one tester processor 104 and at least one FPGA device. The tester processor 104 and the FPGA devices 111A-111M on the site module board run the test methods for each test case in accordance with the test program instructions received from the system controller 101. In one embodiment the tester processor can be a commercially available Intel 8086 CPU or any other well-known processor. Further, the tester processor may be operating on the Ubuntu OS x64 operating system and running the Core Software, which allows it to communicate with the software running on the system controller, to run the test methods. The tester processor 104 controls the FPGA devices on the site module and the DUTs coupled to the site module based on the test program received from the system controller.

The tester processor 104 is coupled to and can communicate with the FPGA devices 111A-111M over bus common bus 112. In one embodiment, tester processor 104 communicates with each of the FPGA devices 111A-111M over a separate dedicated bus. In one embodiment, tester processor 104 can control the testing of the DUTs 120A-120N transparently through the FPGAs with minimal processing functionality allocated to the FPGA devices. In this embodiment, the data traffic capacity of bus 112 can be exhausted rapidly because all the commands and data generated by the tester processor need to be communicated over the bus to the FPGA devices. In other embodiments, the tester processor 104 can share the processing load by allocating functionality to control the testing of the DUTs to the FPGA devices. In these embodiments, the traffic over bus 112 is reduced because the FPGA devices can generate their own commands and data.

In one embodiment, each of the FPGA devices 111A-111M is coupled to its own dedicated memory block 140A-140M. These memory blocks can, among other things, be utilized to store the test pattern data that is written out to the DUTs. In one embodiment, each of the FPGA devices can comprise two instantiated FPGA tester blocks 110A-110B with functional modules for performing functions including implementation of communicative protocol engines and hardware accelerators as described further herein. Memory blocks 140A-140 M can each contain one or more memory modules, wherein each memory module within the memory block can be dedicated to one or more of the instantiated FPGA tester blocks 110A-110B. Accordingly, each of the instantiated FPGA tester blocks 110A-110B can be coupled to its own dedicated memory module within memory block 140A. In another embodiment, instantiated FPGA tester blocks 110A and 110B can share one of the memory modules within memory block 140A.

Further, each of the DUTs 120A-120N in the system can be coupled to a dedicated instantiated FPGA tester block 110A-110N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be coupled to its own dedicated FPGA tester block and be running a different test program.

The architecture of the embodiment of the present invention depicted in FIG. 1 has several advantages. First, it eliminates the need for protocol-specific hardware bus adapter ("HBA") sockets and cards in the system because the communication protocol modules can be programmed directly on the instantiated tester blocks within the FPGA devices. The instantiated tester blocks can be configured to communicate with the DUTs in any protocols that the DUTs support. Accordingly, if DUTs with different protocol support need to be tested, they can be coupled to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 101 without any kind of hardware interactions. For example, the FPGAs 111A-111M in the ATE apparatus 100 can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 111A-111M can be configured, e.g., programmed, to run more than one communicative protocol, wherein these protocols also can be downloaded from system controller 101 and configured through software. For example, instantiated FPGA tester block 110A can be configured to run the PCIe protocol while instantiated FPGA tester block 110B can be configured to run the SATA protocol. This allows the tester hardware to test DUTs supporting different protocols simultaneously. FPGA 111A can now be coupled to test a DUT that supports both PCIe and SATA protocols. Alternatively, it can be coupled to test two different DUTs, one DUT supporting the PCIe protocol, and the other DUT supporting the SATA protocol.

Another advantage of the architecture presented in FIG. 1 is that it reduces processing load on the tester processor 104 by distributing the command and test pattern generating functionality to FPGA devices, where each DUT has a dedicated FPGA module running the test program specific to it. For instance, instantiated FPGA tester block 110A is coupled to DUT 120A and runs test programs specific to DUT 120A, for example, a solid state drive. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 112 coupling the tester processor with the other hardware components, including FPGA devices, device power supplies (DPS) and DUTs, is also reduced. As a result more DUTs can be tested simultaneously than in prior configurations.

Figure 2:
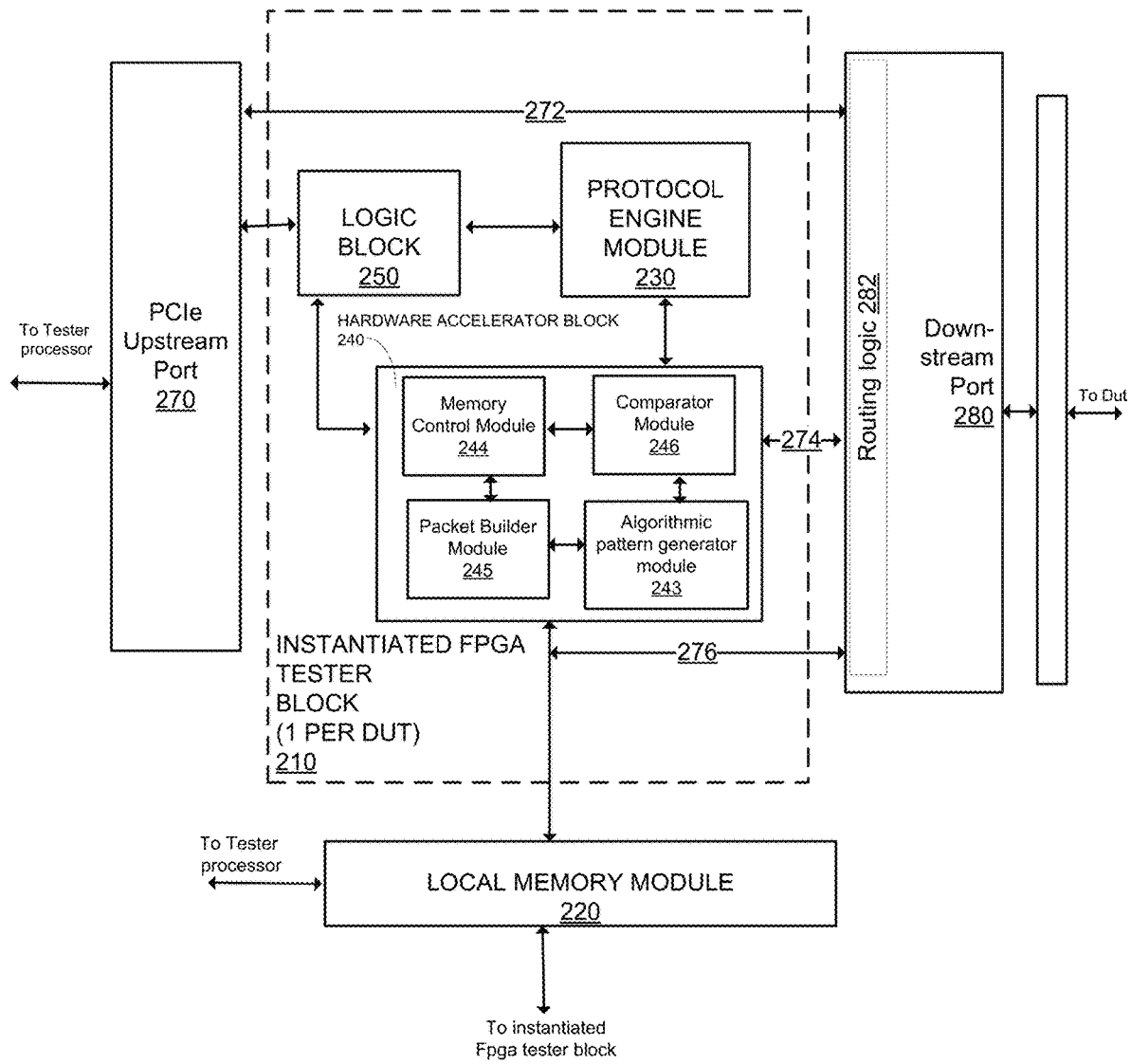
FIG. 2 is a detailed schematic block diagram of an exemplary instantiated FPGA tester block, according to an embodiment of the present invention.

FIG. 2 is a detailed schematic block diagram of an exemplary instantiated FPGA tester block of FIG. 2, according to an embodiment of the present invention.

Referring to FIG. 2, the instantiated FPGA tester block 210 is connected to the tester processor through PCIe upstream port 270 and to the DUT, e.g., DUT 120A of FIG. 1, through downstream port 280. It is appreciated that downstream port 280 is configured to communicate with a device under test, and may implement any required interface, including bus interfaces, for example, PCIe, ATA, SATA, NVMe, USB, SPI, JTAG, and/or SAS.

Instantiated FPGA block 210 can comprise a protocol engine module 230, a logic block module 250, and a hardware accelerator block 240. The hardware accelerator block 240 can further comprise a memory control module 244, comparator module 246, a packet builder module 245, and an algorithmic pattern generator (APG) module 243.

In one embodiment, logic block module 250 comprises decode logic to decode the commands from the tester processor, routing logic to route all the incoming commands and data from the tester processor 104 and the data generated by the FPGA devices to the appropriate modules, and arbitration logic to arbitrate between the various communication paths within instantiated FPGA tester block 210.

In one embodiment, the communication protocol used to communicate between the tester processor and the DUTs can advantageously be reconfigurable. The communicative protocol engine in such an implementation may be programmed directly into the protocol engine module 230 of instantiated FPGA tester block 210, in some embodiments. The instantiated FPGA tester block 210 can therefore be configured to communicate with the DUTs in any protocol that the DUTs support. This advantageously eliminates a need for hardware bus adapter cards, and no protocol-specific hardware needs be replaced to test DUTs with different protocol support. In one embodiment, the protocols can be high-speed serial protocols, including but not limited to SATA, SAS, or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In FIG. 2, if the DUT coupled to the downstream port 280 is a PCIe device, for example, a bit-file containing the instantiation of the PCIe protocol may be downloaded, for example, through a JTAG interface to the FPGA devices 111A-111M. Each FPGA device 111A or 111B (FIG. 1) can comprise one or more instantiated FPGA tester blocks and, consequently, one or more protocol engine modules. The number of protocol engine modules that any one FPGA device can support is limited only by the size and gate count of the FPGA.

In one embodiment of the present invention, each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol, and the other DUT supporting the SATA protocol.

The hardware accelerator block 240 of FIG. 2 can be used to expedite certain functions on FPGA hardware than would be possible to do in software on the tester processor. The hardware accelerator block 240 can supply the initial test pattern data used in testing the DUTs. It can also contain functionality to generate certain commands used to control the testing of the DUTs. To generate test pattern data, accelerator block 240 uses the algorithmic pattern generator module 243.

The hardware accelerator block 240 can use comparator module 246 to compare the data being read from the DUTs to the data that was written to the DUTs in a prior cycle. The comparator module 246 comprises functionality to flag a mismatch to the tester processor 104 to identify devices that are not in compliance. More specifically, the comparator module 246 can comprise an error counter that keeps track of the mismatches and communicates them to the tester processor 304.

Hardware accelerator block 240 can connect to a local memory module 220. Memory module 220 performs a similar function to a memory module within any of the memory blocks 240A-240M. Memory module 220 can be controlled by both the hardware accelerator block 240 and the tester processor 104 (FIG. 1). The tester processor 104 can control the local memory module 220 and write the initial test pattern data to it.

The memory module 220 stores the test pattern data to be written to the DUTs and the hardware accelerator block 240 accesses it to compare the data stored to the data read from the DUTs after the write cycle. The local memory module 220 can also be used to log failures. The memory module would store a log file with a record of all the failures the DUTs experienced during testing. In one embodiment, the accelerator block 240 has a dedicated local memory module block 220 that is not accessible by any other instantiated FPGA tester blocks. In another embodiment, the local memory module block 220 is shared with a hardware accelerator block in another instantiated FPGA tester block.

Hardware accelerator block 240 can also comprise a memory control module 244. The memory control module 244 interacts with and controls read and write access to the memory module 220.

The hardware accelerator block 240 comprises a packet builder module 245. The packet builder module is used by the hardware accelerator block in certain modes to construct packets to be written out to the DUTs comprising header/command data and test pattern data.

In certain embodiments, hardware accelerator block 240 can be programmed by the tester processor 104 to operate in one of several modes of hardware acceleration. In bypass mode, the hardware accelerator is bypassed and commands and test data are sent by the tester processor 104 directly to the DUT through path 272. In hardware accelerator pattern generator mode, test pattern data is generated by the APG module 243 while the commands are generated by the tester processor 304. The test packets are transmitted to the DUT through path 274. In hardware accelerator memory mode, the test pattern data is accessed from local memory module 220 while the commands are generated by the tester processor 304. The test pattern data is transmitted to the DUT through path 276. Routing logic 282 is configured to arbitrate among paths 272, 274 and 276 to control the flow of data to the DUT.

The site module can comprise a plurality of general-purpose connectors 181. Because the protocol engine module 230 can be configured to run any number of various communicative protocols, a general-purpose high-speed connector 181 may be required on the site module. Accordingly, if the protocol implemented on the protocol engine module 230 needs to be changed, no accompanying physical modification needs to be made on the site module. The site module connects to the DUT using a load board, e.g., load board 180 of FIG. 1, that can connect to the general-purpose connector 181 on the site module end, but is specific to the protocol and connectors being implemented on the DUT end. DUTs supporting different communicative protocols will require different configurations. Accordingly, the load board may need to be switched out and replaced if the protocol is reprogrammed to accommodate DUTs requiring a different configuration.

In order to test a solid state drive (SSD), a tester processor, e.g., tester processor 104 of FIG. 1, sends a command to a tester block, e.g., tester block 210 of FIG. 2. Each tester block corresponds to a specific device under test (DUT), e.g., an SSD. The command is not complex, e.g., read or write an amount of data starting at an address. In accordance with embodiments of the present invention, the amount of data and the starting address need not be constrained. For example, the amount of data is not constrained to be an integral multiple of a data sector size, and the starting address is not constrained to fall on a sector boundary. In some embodiments of the present invention, the transfer may comprise an integral multiple of a data sector size, and/or the starting address may fall on a sector boundary.

Figure 3:
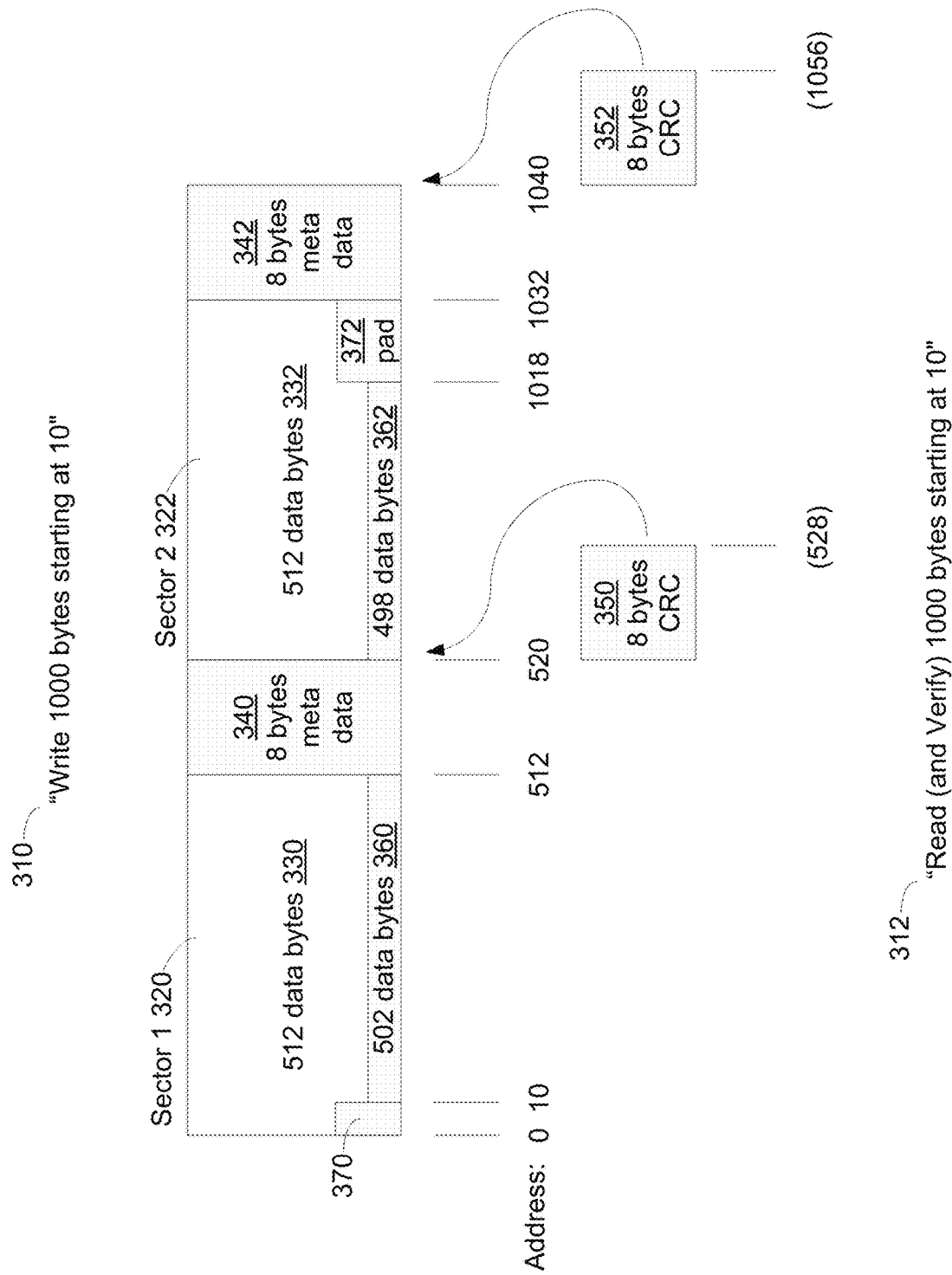
FIG. 3 is an exemplary data diagram illustrating processing a command from a tester processor.

FIG. 3 is an exemplary data diagram illustrating processing a command from a tester processor. The command 310 is to write 1000 bytes of data starting at address 10. In this example, each SSD sector comprises 512 bytes of data, 8 bytes of meta data. Eight bytes of protection information, in the form of a CRC, are transferred, but not stored. The CRC may cover the sector data or the sector data and the meta data, in some embodiments. Thus, the SSD transfers 528 bytes of data, and stores 520 bytes (512 bytes of data plus 8 byte of meta data).

Two sectors 320, 322 of the exemplary SSD are illustrated. Each sector stores 512 bytes of data, e.g., sector data 330, and 8 bytes of meta data, e.g., meta data 340. In response to the write command, 502 bytes of data are written to sector 1 320, beginning at address 10, and the remaining (1000−502=498) 498 bytes of data are written to sector 2, 322, beginning at address 520, the first address of sector 2 322.

It is also to be appreciated that meta data 340, 342 for each sector 320, 322 is also written. In general, such meta data is invisible to operating system and application software, and thus it is not included in the transfer of data from a tester processor. The meta data is arbitrary, and may be generated, e.g., by an algorithmic pattern generator (APG) module 243, as illustrated in FIG. 2.

It is to be further appreciated that CRC 350 and CRC 352 are transferred to the SSD, but not stored. For example, CRC 350 is computed based on the data sent to sector 1 320, including the meta data. The CRC 350 is transmitted (in the case of the exemplary write command) subsequent to the transfer of data and meta data for a sector to the SSD, and prior to the transfer of information of a next sector. Thus, 528 bytes of data are transferred for each sector, while only 520s are stored. In general, such CRC data is invisible to operating system and application software, and thus it is not included in the transfer of data from a tester processor. The CRC data may be computed, e.g., by an algorithmic pattern generator (APG) module 243, as illustrated in FIG. 2.

In some embodiments, sector data, e.g., sector data 330, 332, may be provided by a tester processor. However, in accordance with embodiments of the present invention, sector data is generated locally, e.g., by algorithmic pattern generator module 243 of FIG. 2. Generating sector data locally, e.g., within a tester block, may provide performance improvements, in comparison to generating test data by a tester processor, and transferring such test data from a tester processor to a tester block. For example, algorithmic pattern generator module 243 may generate sector data more efficiently than a general-purpose processor, e.g., tester processor 104 (FIG. 1). In addition, by generating sector data locally, such data does not have to be transferred from a tester processor to a tester block.

In accordance with embodiments of the present invention, a tester block is able to generate sector data, generate meta data, and compute CRC data in response to a high level command from a tester processor. The command does not transfer data from the tester processor.

In accordance with embodiments of the present invention, the generated sector data, generated meta data, and generated pad data are generated by a pseudo-random number generator, based on sector number, or sector start address. For example, sector number is used as a partial seed for a pseudo-random number generator. For example, a pseudo-random number generator has a first seed, or a first portion of a seed, that is fixed for a given test. The pseudo-random number generator has a second seed, or a second portion of a seed, that is the sector number. In this novel manner, the same pseudo-random sequence is always generated for any given sector, as long as the first seed, or first portion of a seed is unchanged. The first seed, or first portion of a seed, may be changed for subsequent testing, to ensure that different data is written to the exemplary sector for different tests.

For a given test, e.g., for a fixed first seed, or first portion of a seed, the same pseudo-random data is always generated and written to a given sector. Thus, when reading from the given sector, the pseudo-random sequence may be generated again for comparison to the data that was written according to the same pseudo-random sequence. Accordingly, write data does not need to be maintained in the test equipment during a test. Rather, a pseudo-random sequence, based on sector number, is generated and written to an SSD. When a given sector is subsequently read, the same pseudo-random sequence, based on sector number, is generated on the test equipment, e.g., by an algorithmic pattern generator (APG) module 243, as illustrated in FIG. 2, for comparison with the data read from the SSD.

It is to be appreciated that a typical SSD may store much greater volumes of data than typical computer "working" memories, e.g., DRAM. In this novel manner, an SSD under test may be commanded to store more data than may be contained by available working memory, e.g., memory located in memory block 220 of FIG. 2, or associated with tester processor 104 (FIG. 1). In accordance with embodiments of the present invention, the pseudo-random sequences stored to the SSD under test do not need to be stored outside of the SSD, e.g., within the test equipment, so that the data may later be compared with data read from the SSD under test. Further, since the data written does not need to be stored within the test equipment, e.g., for a subsequent verification, the test equipment is able to execute numerous commands between writing a given sector, and reading that sector.

Still with reference to FIG. 3, an exemplary read command will be described. The exemplary read command 312 is the complement of command 310, e.g., "read 1000 bytes starting at 10." The test equipment determines where the data is located in terms of SSD sectors. In this embodiment, the 1000 bytes of data are contained within sectors 1 320 and 2 322. Thus, the test system commands the SSD to read sectors 1 320 and 2 322. In response, the test system receives 1056 bytes of data from the SSD, e.g., 528 bytes for each of sector 1 320 and sector 2 322. The received data includes 8 bytes of CRC data for each sector. The tester may optionally compute a CRC for the received data to compare with the received CRC.

The tester receives two blocks of sector data, e.g., 330, 332, and two blocks of meta data, e.g., 340, 342. If the tester processor requests the actual data, the tester block may strip out the pad data prior to sending the actual data to the tester processor. In accordance with embodiments of the present invention, the read data may be verified by the tester block, e.g., tester block 210 of FIG. 2, without sending the data to a tester processor and without storing the data outside of the specific SSD under test.

If the tester processor optionally commands the tester block to verify the read data, the tester block may generate the pseudo-random sequence, based on the sector number(s) read, and compare the read data with the pseudo-random sequence. For example, if all sector data corresponds to the regenerated pseudo-random sequence(s), and all CRCs compare, the tester block may report to the tester processor that the write and read operations were verified and successful.

Testing a solid state drive generally involves writing data to the solid state drive, reading back the data from the solid state drive, and comparing the written data to the data that is read. Solid state drives are generally referred to or known as "storage" devices, which are differentiated from computer "memory" or "memory devices." "Memory" and "storage" are generally described or referred to as being at different levels of a computer memory "hierarchy." Unlike "memory," storage devices in general, and solid state drives more particularly, typically read and write data in "sectors," e.g., blocks of, for example, 256 or 512 bytes. In general, individual bytes within a sector may not be directly accessed. For example, the third byte of a sector may not be read without reading the entire sector.

It is generally desirable to test a solid state drive based on arbitrary starting addresses. For example, the starting address of a write command is not required to be aligned with the start of a sector. Accordingly, it is necessary to determine where such an arbitrary address falls within the sectors of an SSD. For example, with reference to the example of FIG. 3, the tester must determine which SSD sector contains the data at the arbitrary address of 10. The tester must also determine which subsequent sectors are to be written or read, based on the arbitrary amount of data.

These calculations must be performed for every read and/or write command issued by a tester processor. It is thus desirable to perform such calculations as fast as possible, such that such "address to sector" do not degrade the rate of testing of an SSD.

Under the conventional art, with sector sizes for SSD and hard disk drives traditionally a power of an integral power of two, e.g., 256 or 512 bytes, determination of a sector number from a given, arbitrary, address was considered "simple," as the calculation could be performed primarily by shifting a binary number in a register. As is well known, such shifting of a binary number performs multiplication or division by powers of two. Such shifting is generally considered a very fast operation.

However, if a sector size, e.g., of an SSD, is not an integral power of two, e.g., 520 bytes, the calculation of a sector number from a given, arbitrary, address is not considered "simple." For example, $$SNum = Addr/520 \quad \text{(Relation 1)}$$

$$SOs = Addr \% 520 \quad \text{(Relation 2)}$$

where "Addr" is the Address input to calculate Sector Number, "SNum" is the Sector Number, "SOs" is the Sector Offset, and "%" is the modulus operator.

A first translation method uses multipliers as a divider:

$$SNum = (Addr/520) = (Addr*(1/520)) = (Addr*(2^{\wedge}N/520))/2^{\wedge}N = (Addr*(1 << N/520)) >> N$$

where $2^{\wedge}N$ is a fixed scaling constant so that $2^{\wedge}N/520$ is an integer large enough to compute SNum without rounding errors for any Address within a given range. It is appreciated that multipliers usually require pipeline stages which takes clock cycles, which in turn increase latency.

This translation approach requires multipliers which generally impose an unacceptable latency time. Accordingly, a typical implementation of this method may be considered unacceptably slow.

In accordance with embodiments of the present invention, the sector number may be determined from a given address using only addition and subtraction, based on the assumption that there is an "address prime" that can be determined by division by 2, e.g., shifting a binary number, that is close enough to the actual address, e.g., "addr," divided by the actual sector size, e.g., 520. For example, given a sector size of 520, as before, then SNum=Addr/520. Is there an Addr' such that Addr/520 is equivalent to Addr'/512.

EXAMPLE

Use Addr=10,400 and SectorSize=520 as example
Correct Answer is:

$$SNum=10,400/520=20.0000$$

Addr' should be:

$$Addr'=SNum*512=20.000*512=10,240$$

$$10400/520==10240/512$$

$$20==20$$

Simply dividing by 512, e.g., an integral power of two, which may be implemented by shifting, instead of the actual sector size 512, produces an error:

$$10,400/512=20.3125 \quad \text{First Approximation:}$$

Result is High by (520/512), or by 1/64 too high.
Adjusting the result DOWN by $1/64\wedge2$ results in:

$$10,400/512-10400/512/64=20.3125- \\ 0.3173828125=19.9951171875 \quad \text{Second Approximation:}$$

Result is low by 520/512/64 or by $1/64\wedge2$.
Adjusting the second approximation UP by $1/64\wedge3$ $$10,400/512-10400/512/64+10400/512/64/ \\ 64=20.3125-0.3173828125+ \\ 0.0049591064453125=20.0000076293945 \quad \text{Third Approximation:}$$

Result is high by 520/512/64/64 or by $1/64\wedge3$
This pattern continues until enough sectors have been identified to include the specified amount of data in the test command.

In general, an Address input to calculate Sector Number, "addr," may be transformed to address prime, "addr'," as described below. It is appreciated at all division is by an integral power of two, which can be implemented by shifting a binary number.

Address Prescaled UP for Accuracy, (Plus Add 1/2 LSB for Rounding)

$$AddrPS=(Addr<<N)+(1<<N-1) \text{ (e.g. N=24)}$$

$$AddrPs=10,400.5<<24=174,491,435, \\ 008=0x28a0<<24=0x28a0000000+ \\ 1<<23=0x28a0800000$$

where "AddrPS" is an address that has been prescaled for accuracy.

The following transform is done with Prescale Address, then scaled back down.

$$Addr'=(AddrPS-Correction1+Correction2-Correction3)>>N=(AddrPS-AddrPs>>6+AddrPs>>12- \\ AddrPs>>18)>>N=(0x28a0800000- \\ 0xA2820000+0x28a0800- \\ 0xA2820) \\ >>24=0x28007DDFE0>>24=0x2800=10,240$$

The following illustrates a "Calculate SNum" operation using Addr'/512 (instead of Addr/520):

$$SNum=Addr'/512=10240/ \\ 512=0x2800>>9=0x0014=20$$

Sector Start is Address where SOs==0

$$SecStart=SNum*(512+8)=(SNum*512)+(SNum*8)= \\ (SNum<<9)+(SNum<<3)=20*512+20*8=10, \\ 240+160=10,400$$

Sector Offset=Addr-SecStart where "SecStart" is the starting address for a given sector.

All math uses only simple Add/Subtract/Shift-Left/Shift-Right operations. In addition, the calculations may be pipelined at any level needed, or none if not needed.

Other non-standard sector sizes may be similarly implemented using different scaling:

| | | | |
|---|---|---|---|
| 520 | 512 + 8 | Difference is 8/512 or 1/64 | Shift is by 6 |
| 528 | 512 + 16 | Difference is 16/512 or 1/32 | Shift is by 5 |
| 4104 | 4K + 8 | Difference is 8/4096 or 1/512 | Shift is by 9 |
| 4112 | 4K + 16 | Difference is 16/4096 or 1/256 | Shift is by 8 |
| 4160 | 4K + 64 | Difference is 64/4096 or 1/64 | Shift is by 6 |
| 4224 | 4K + 128 | Difference is 128/4096 or 1/32 | Shift is by 5 |

The above-described operations may be performed by hardware-based logic, e.g., within logic block 250 of tester block 210 (FIG. 2), in some embodiments. A logic-based implementation of the operations generally will be sufficiently fast so as not to slow down test operations. Such logic may be synthesized according to the descriptions above. In some embodiments, such operations may be performed by a processor operating under software control.

Figure 4:
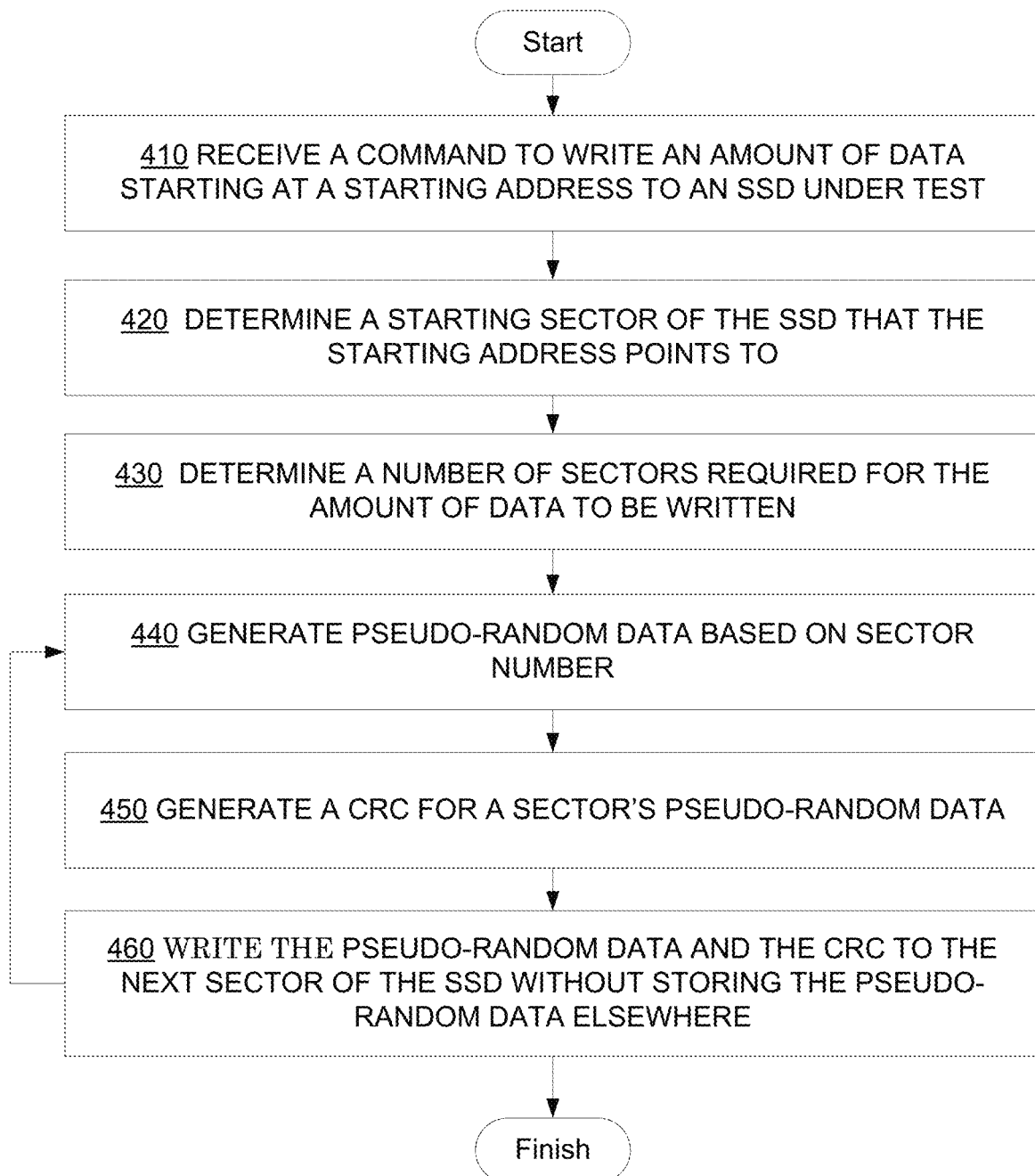
FIG. 4 illustrates an exemplary machine-implemented method of write testing a solid state drive (SSD) having a non-standard sector size, in accordance with embodiments of the present invention.

FIG. 4 illustrates an exemplary machine-implemented method 400 of write-testing a solid state drive (SSD) having a non-standard sector size, e.g., a sector size that is not an integral power of two, in accordance with embodiments of the present invention. Method 400 may be implemented in hardware, e.g., controlled by state machines, in a processor, e.g., controlled by program instructions, on in a combination of the two. In 410, a command is received to write an amount of data, starting at a starting address, to an SSD under test. In 420, a starting sector of the SSD that the starting address points to is determined, for example, according to the processes presented above. In 430, the number of sectors required for the amount of data is determined.

In 440, pseudo-random data, based on a sector number, is generated. In optional 450, a CRC is generated for the sector's pseudo-random data. In 460, the pseudo-random data, and optionally the CRC, is written to the SSD for a next sector. The data written to the SSD is not stored outside of the SSD. For example, the data written is not stored in the tester block 210 or local memory 220 of FIG. 2, the data written is not stored in the tester processor 104, and the data written is not stored in system controller 101 of FIG. 1. If the write is successful, the method continues at 440, until the amount of data has been written. If the write operation is not successful, the sector number and type of error is logged for reporting. In some embodiments, the amount of data written to the SSD may exceed the amount of memory available on the test apparatus.

Figure 5:
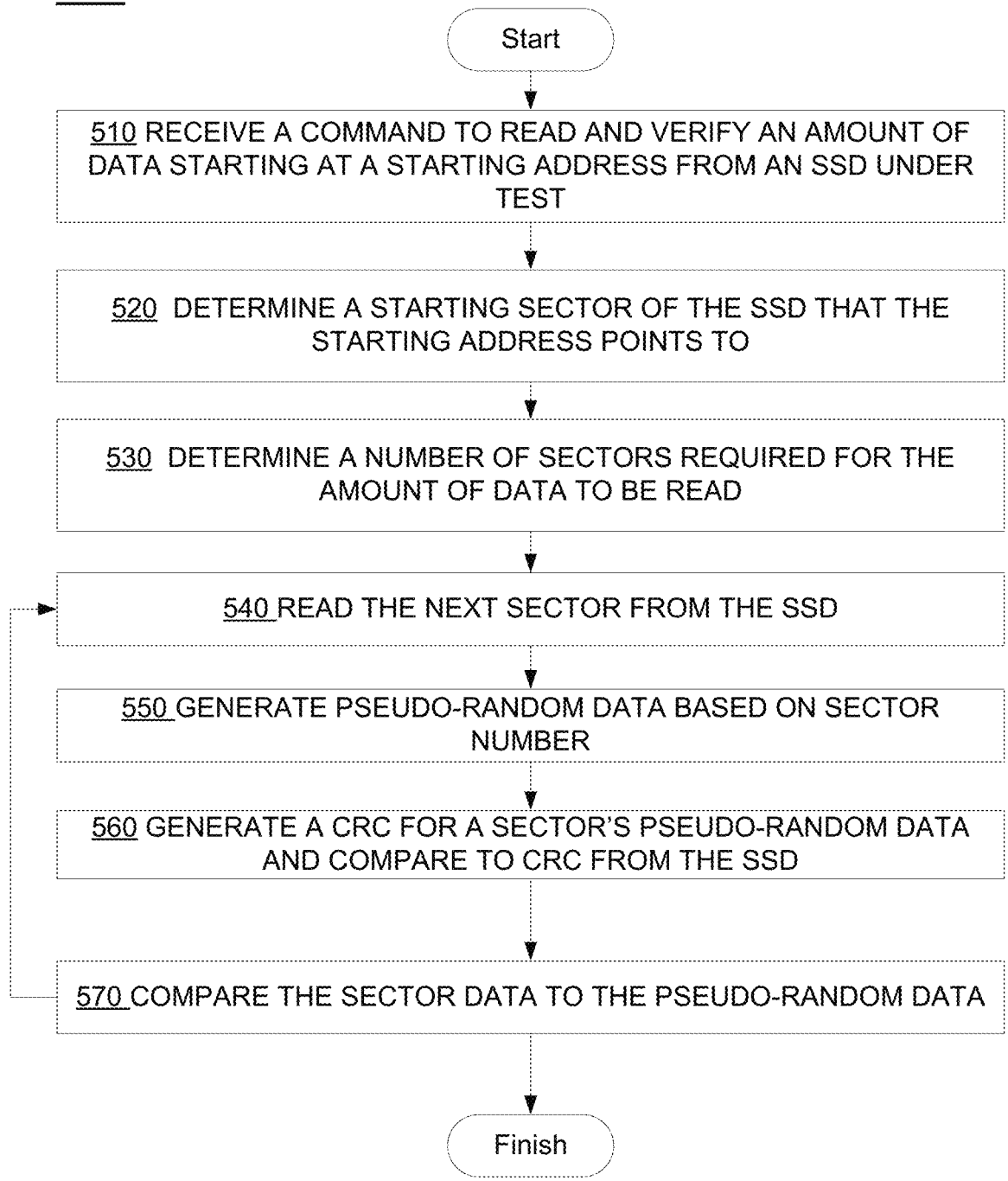
FIG. 5 illustrates an exemplary machine-implemented method of read/verify-testing a solid state drive (SSD) having a non-standard sector size, in accordance with embodiments of the present invention.

FIG. 5 illustrates an exemplary machine-implemented method 500 of read/verify-testing a solid state drive (SSD) having a non-standard sector size, e.g., a sector size that is not an integral power of two, in accordance with embodiments of the present invention. Method 500 may be implemented in hardware, e.g., controlled by state machines, in a processor, e.g., controlled by program instructions, on in a combination of the two. In 510, a command is received to read and verify an amount of data, starting at a starting address, from an SSD under test. In 520, a starting sector of the SSD that the starting address points to is determined, for example, according to the processes presented above. In 530, the number of sectors required for the amount of data is determined.

In 540, a next sector is read from the SSD. In 550, pseudo-random data, based on a sector number, is generated. In optional 560, a CRC is generated for the sector's pseudo-random data and compared to the CRC provided from the SSD. In 570, the sector data is compared to the pseudo-random data. If this comparison of sector data, and the optional CRC comparison are verified, the method continues at 540, until the amount of data has been read and verified. If the comparison of sector data and/or the optional CRC comparison fails, the sector number and type of error is logged for reporting.

Solid State Disk (SSD) formats support sectors which contain both Data and MetaData. The MetaData usually contains "Protection Information" (PI). The format for this protection information can differ slightly between various protocols, for example, Serial Attached SCSI (Small Computer System Interface), generally known as SAS, and/or NVM Express (NVMe). Essentially all storage device protocols implement some form of a cyclic redundancy check (CRC) guard tag as part of the PI fields. A CRC is generally a hash function that enables detection of, and possibly allows for correction of, data errors in a data field. A common CRC in the storage, e.g., SSD, industry utilizes the polynomial 0x8bb7.

Testing of sector-based storage devices, e.g., SSDs, generally requires computation of CRCs. For example, when reading a sector from a device, an Automated Test Environment (ATE) system will read a sector of data and metadata and compute a CRC value for the data. The ATE will then compare the computed CRC value to the CRC value included in the read metadata, for example as previously presented with respect to item 560 of FIG. 5.

Similarly, when writing a sector to a device, an Automated Test Environment (ATE) system will generate a CRC value for the data to be written to the device, and will write the data and the CRC value (in the metadata field) to the device, for example as previously presented with respect to items 450 and 460 of FIG. 4.

A conventional method of computing a CRC is to use a linear shift feedback register (LFSR) using flip-flops and XOR gates to implement the CRC polynomial. Unfortunately, the use of an LFSR generally requires at least one clock cycle for each bit of a sector, resulting in a CRC calculation duration that is much longer than the read/write cycle time of an ATE system. Consequently, using an LFSR to calculate a CRC over large sector sizes would deleteriously slow down ATE system operations.

In accordance with embodiments of the present invention, a "packet" of data may be read by an ATE system from a device under test, e.g., an SSD, or generated by an ATE system and written to a device under test, e.g., an SSD, at a data rate of 8 gigabytes per second or higher. It is thus desirable to generate CRC data at a commensurate clock rate, e.g., every 4 nanoseconds.

A CRC may be calculated by a CRC parallel generator in significantly less time that a convention serial implementation utilizing an LFSR. However, the calculation of a 16-bit CRC (CRC16) for use within an ATE system testing a storage device requires a very wide input, e.g., 256 or 512 bits wide, in order to achieve desirable data throughput rates. Unfortunately, such large data widths lead to a great numbers of logic levels, stages, or depth for a CRC parallel generator. For example, to compute a 16-bit CRC for a 256-bit input would require about 150 stages of XOR gates for each of the 16 CRC bits. Such "deep" logic, while faster than a "serial" CRC implements, has unacceptable gate propagation times, which would slow down ATE system operations to unacceptable performance levels. Further, such a high number of logic stages requires undesirably large chip areas to implement, and may not be realizable in some logic technologies, e.g., field programmable gate arrays (FPGAs).

Table 1, below, illustrates an exemplary system for determining a 4-bit CRC5.

TABLE 1

```
// CRC Matrix Term
    lfsr_cd[ 0 ] = din[ 0 ] ;
    lfsr_cd[ 1 ] = 0;
    lfsr_cd[ 2 ] = din[ 0 ] ;
    lfsr_cd[ 3 ] = 0;
    lfsr_cd[ 4 ] = 0;
// shift(1) -- Output Shifted 1 clock
    lfsr_cq[ 0 ] = crc[ 4 ] ;
    lfsr_cq[ 1 ] = crc[ 0 ] ;
    lfsr_cq[ 2 ] = crc[ 1 ] ^ crc[ 4 ] ;
    lfsr_cq[ 3 ] = crc[ 2 ] ;
    lfsr_cq[ 4 ] = crc[ 3 ] ;
// shift(2) -- Output Shifted 2 clocks
    lfsr_cq[ 0 ] = crc[ 3 ] ;
    lfsr_cq[ 1 ] = crc[ 4 ] ;
    lfsr_cq[ 2 ] = crc[ 0 ] ^ crc[ 3 ] ;
    lfsr_cq[ 3 ] = crc[ 1 ] ^ crc[ 4 ] ;
    lfsr_cq[ 4 ] = crc[ 2 ] ;
// shift(3) -- Output Shifted 3 clocks
    lfsr_cq[ 0 ] = crc[ 2 ] ;
    lfsr_cq[ 1 ] = crc[ 3 ] ;
    lfsr_cq[ 2 ] = crc[ 2 ] ^ crc[ 4 ] ;
    lfsr_cq[ 3 ] = crc[ 0 ] ^ crc[ 3 ] ;
    lfsr_cq[ 4 ] = crc[ 1 ] ^ crc[ 4 ] ;
// shift(4) -- Output Shifted 4 clocks
    lfsr_cq[ 0 ] = crc[ 1 ] ^ crc[ 4 ] ;
    lfsr_cq[ 1 ] = crc[ 2 ] ;
    lfsr_cq[ 2 ] = crc[ 1 ] ^ crc[ 3 ] ^ crc[ 4 ] ;
    lfsr_cq[ 3 ] = crc[ 2 ] ^ crc[ 4 ] ;
    lfsr_cq[ 4 ] = crc[ 0 ] ^ crc[ 3 ] ;
```

The result is four CRC5 outputs that are the "data-only" portion contribution to the overall CRC output. All 4 of the sub-messages are aligned with each other with respect to their data position in the overall clocking. These now are combined (XORed) with the contribution from the current CRC output value. That contribution needs to be the current value, shifted 4 clocks, or H2_shift(4). The reference to "as if data were 0." Consider a CRC at any value, and the data is always 0, and clock the CRC n times. The CRC value will change on every clock. The contribution for the change in output will be solely based on its current value. The data is calculated separately, and all aligned to 4 clocks, even though this was performed in a single clock cycle. The CRC contribution is calculated separately and also aligned to 4 clocks. The CRC contributions are combined to produce the same output in one clock cycle.

Figure 6:
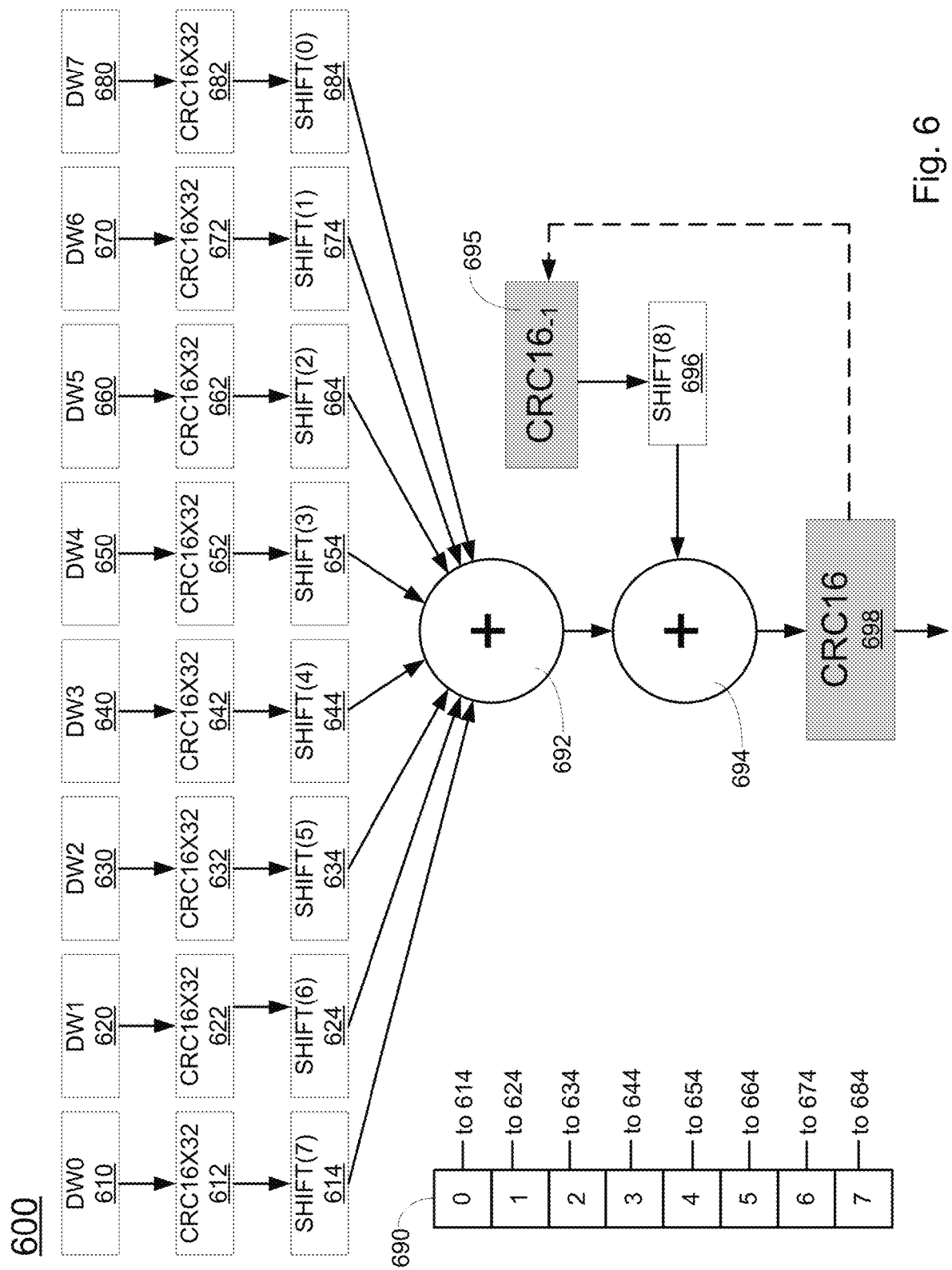
FIG. 6 illustrates an exemplary schematic of a fast parallel CRC determination circuit, in accordance with embodiments of the present invention.

FIG. 6 illustrates an exemplary schematic of a fast parallel CRC determination circuit 600, in accordance with embodiments of the present invention. Fast parallel CRC determination circuit 600 determines a 16-bit CRC to cover a packet of input data, in this example, 256-bits.

A 256-bit input packet is divided into eight 32-bit double words (DW), DW0 610 through DW7 680. The data in each of DW0 610 through DW7 680 may also be known as or referred to as a "sub-word." Each CRC16×32 logic 612 though 682 computes a 16-bit CRC across or from the corresponding 32-bit sub-word of the 256-bit input. The output of each CRC16×32 logic 612 though 682 is known as or referred to as a "sub-CRC." Each CRC16×32 logic 612 though 682 may determine a sub-CRC in one clock cycle, in some embodiments.

Determination of a sub-CRC is the equivalent of shifting the subword through an LFSR that has no prior state (Min=0) to obtain a sub-CRC result for the sub-word. This is done for each DWn and the circuit is the same for all DWn. A different instantiation of the circuit processes each different DWn. Therefore, 8 sub-CRC values may be computed in parallel in one clock cycle. For example, DW0 610 assumes bit positions 31:0 and is padded with a shift of 224-bits. DW1 620 assumes bit positions 63:32 and is padded with a shift of 192-bits. DW2 assumes bit positions 95:64 and is padded with a shift of 160-bits, etc.

Table 2, below, illustrates an exemplary implementation of CRC16×32 logic 612:

TABLE 2

```
// Terms derived entirely from data_in
lfsr_cd[0]  = din[0] ^ ... ^ din[29] ; // depth=21
lfsr_cd[1]  = din[0] ^ ... ^ din[30] ; // depth=16
lfsr_cd[2]  = din[0] ^ ... ^ din[31] ; // depth=19
lfsr_cd[3]  = din[1] ^ ... ^ din[30] ; // depth=18
lfsr_cd[4]  = din[0] ^ ... ^ din[31] ; // depth=15
lfsr_cd[5]  = din[0] ^ ... ^ din[31] ; // depth=15
lfsr_cd[6]  = din[1] ^ ... ^ din[30] ; // depth=14
lfsr_cd[7]  = din[0] ^ ... ^ din[31] ; // depth=17
lfsr_cd[8]  = din[0] ^ ... ^ din[31] ; // depth=11
lfsr_cd[9]  = din[0] ^ ... ^ din[29] ; // depth=19
lfsr_cd[10] = din[1] ^ ... ^ din[30] ; // depth=19
lfsr_cd[11] = din[0] ^ ... ^ din[31] ; // depth=16
lfsr_cd[12] = din[1] ^ ... ^ din[26] ; // depth=15
lfsr_cd[13] = din[2] ^ ... ^ din[27] ; // depth=15
lfsr_cd[14] = din[3] ^ ... ^ din[28] ; // depth=15
lfsr_cd[15] = din[0] ^ ... ^ din[28] ; // depth=20
```

This computation determines a "CRC16×32" based on a 32-bit data input. It is a partial result that will be combined later with the other DWords and necessary shifting. The additional instances of CRC16×32 logic are similar.

The next stage of fast parallel CRC determination circuit 600, shift(n) logic 614 through 684, performs the equivalent function of shifting a respective sub-CRC value (from above) through an LFSR, with the addition of shifting zeros through the LFSR a number of times that depends on the position of the original sub-word within the 256 bit data input. For example, DW6 is shifted by 32 bits, with Din=zeros Table 3, below, illustrates an exemplary implementation of shift(7) logic 614:

TABLE 3

```
// Terms derived entirely from current state of CRC
lfsr_cq[0]  = crc[2] ^ ... ^ crc[13]; // depth=10
lfsr_cq[1]  = crc[0] ^ ... ^ crc[14]; // depth=7
lfsr_cq[2]  = crc[0] ^ ... ^ crc[15]; // depth=12
lfsr_cq[3]  = crc[1] ^ ... ^ crc[14]; // depth=11
lfsr_cq[4]  = crc[3] ^ ... ^ crc[15]; // depth=7
lfsr_cq[5]  = crc[0] ^ ... ^ crc[15]; // depth=7
lfsr_cq[6]  = crc[0] ^ ... ^ crc[14]; // depth=7
lfsr_cq[7]  = crc[1] ^ ... ^ crc[15]; // depth=9
lfsr_cq[8]  = crc[4] ^ ... ^ crc[15]; // depth=4
lfsr_cq[9]  = crc[0] ^ ... ^ crc[13]; // depth=10
lfsr_cq[10] = crc[0] ^ ... ^ crc[14]; // depth=11
lfsr_cq[11] = crc[0] ^ ... ^ crc[15]; // depth=4
lfsr_cq[12] = crc[0] ^ ... ^ crc[10]; // depth=4
```

TABLE 3-continued

```
lfsr_cq[13] = crc[0] ^ ... ^ crc[11]; // depth=5
lfsr_cq[14] = crc[0] ^ ... ^ crc[12]; // depth=6
lfsr_cq[15] = crc[1] ^ ... ^ crc[12]; // depth=10
```

There is no data input, as it is assumed to be "0" at all times. The "shift" in this example is 32 bits to correspond to the same bus width as the data. This is equivalent to advancing the CRC by 32 bit-calculations (1 DWord) with Data-In equal to "0." For example, shift(1) 674 is the equivalent change to the LFSR that clocked serially over 32 data bits (since the data input width is 32) with Data=0. Shift(2) 664 is the equivalent change of the LFSR over 2*32 or 64 bits, etc., while shift(7) 614 is the equivalent change over 7*32 or 224 bits.

Table 4, below, illustrates a relationship between the position of the original DW(n) in the input packet and the corresponding shift factor "I," in accordance with embodiments of the present invention. For example, the output of CRC16×32 logic 632, corresponding to double word DW(2) 630, is shifted by 32×5 bits by shift(5) logic 634, where I equals 5.

TABLE 4

| DW(n) | CRC of DW(n) | Shift CRC by (32 * I) |
|---|---|---|
| DW(0) | CRC(DW(0)) | 32 * 7 |
| DW(1) | CRC(DW(1)) | 32 * 6 |
| DW(2) | CRC(DW(2)) | 32 * 5 |
| DW(3) | CRC(DW(3)) | 32 * 4 |
| DW(4) | CRC(DW(4)) | 32 * 3 |
| DW(5) | CRC(DW(5)) | 32 * 2 |
| DW(6) | CRC(DW(6)) | 32 * 1 |
| DW(7) | CRC(DW(7)) | 32 * 0 |

Similar equations can be generated for shifting by 2 DWords or more, e.g., up to 8 DWords, and each has a similar logic depth which is small and manageable for fast CRC calculations. Using this parallel CRC technique, the largest fan-in path between pipeline stages is about 40 levels of logic. It is also possible to pipeline the datapath which would further reduce the fan-in between pipeline stages and increase clock frequency.

The CRC16×32 logic stages 612 through 682 operate in parallel. The shift(n) logic stages 614 through 684 operate in parallel. Each shift(n) logic stage operates on the data provided by the corresponding and proceeding CRC16×32 logic stage. In this manner, each CRC16×32 logic stage operates sequentially with the corresponding and following shift(n) logic stage.

In accordance with embodiments of the present invention, both sets of stages, CRC16×32 logic stages 612 through 682 and shift(n) logic stages 614 through 684, may operate in one clock cycle. In other embodiments, the CRC16×32 logic stages and the shift(n) logic stages may be pipelined, for example, if timing closure is a problem. The output of the CRC16×32 logic stages and the shift(n) logic stages may be registered, as long as the shift(8) 698 is also delayed by the same number of pipelines clocks, so as to align with the propagation through the prior logic stages. Pipelining may enable a higher clock rate, in some embodiments.

XOR gate 692 produces an XOR of the results from shift(n) logic 614 through 684. To calculate the next state of the output CRC16 698, its contribution needs to update the previous output value based on the fact that it shifted 256 times, even if all of the incoming 256-bit data are 0. Shift(8) 696 is the equivalent of the LFSR changing over 256 bits, assuming data=0.

XOR gate 694 XORs the output of XOR gate 692 with a shifted version of the previous CRC16 result (CRC16$_{-1}$) to produce CRC16 698, the final CRC of the 256-bit input.

Although circuit 600 is illustrated as having an exemplary input packet size of 256 bit, circuit 600 may be expanded to comprise an input packet size of 512 bits without a significant increase in propagation delay, in accordance with embodiments of the present invention. For example, CRC16×32 functions 612 through 682 could be expanded to perform a CRC on 64 bits.

In some circumstances, the data input to fast parallel CRC determination circuit 600 may not be all valid data. For example, if a data sector is not an integer multiple of the input packet size, e.g., an input packet size of 256 bits, then there will be less than 256 bits of valid input data for a "remainder" portion of the data sector, typically the last portion of the sector data. For example, the last portion of data may only have 2 DWords of valid data. For 2DW (64-bit) on that clock cycle, the circuit needs to change a bit to account for 64-bits of data, not 256-bits. In this case, the shift for DW0 is 1 not 7, and DW1 shift is 0 not 6, etc. and the final CRC shift is 2 not 8.

Still with respect to FIG. 6, Double Word (DWord) enable register 690 identifies which double words of an input packet are valid. Based on a valid bit indicating that a corresponding set of higher order DWords is invalid, DWord enable register 690 indicates to the lower order shift(n) 614 to 684 functional blocks and shift(8) 698 to adjust their shifts based on the reduced amount of valid data.

Figure 7:
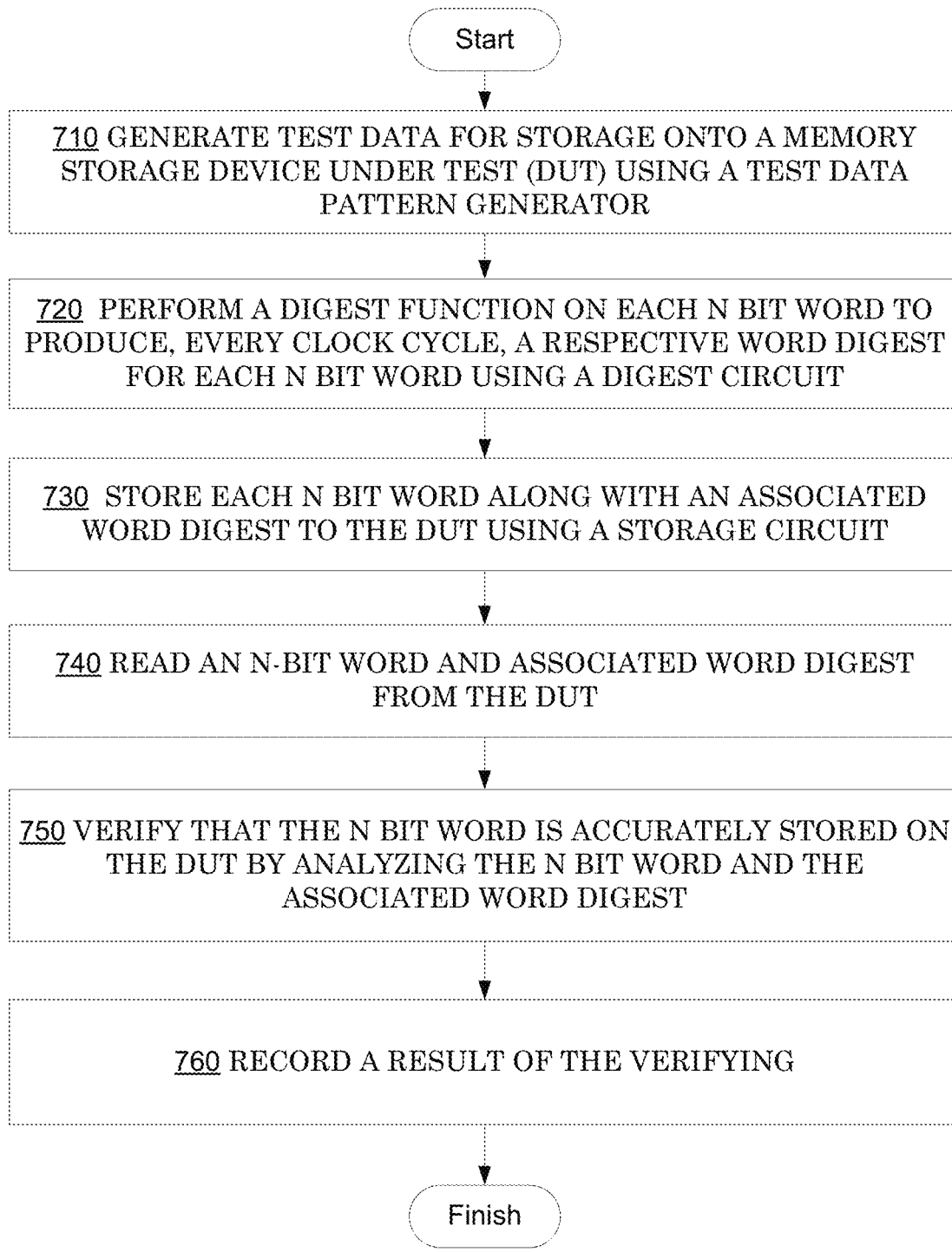
FIG. 7 illustrates an exemplary method of testing memory storage devices, in accordance with embodiments of the present invention.

FIG. 7 illustrates an exemplary method 700 of testing memory storage devices, in accordance with embodiments of the present invention. In 710, test data is generated for storage onto a memory storage device under test (DUT) using a test data pattern generator. The generating produces a respective N bit word every clock cycle and wherein the N bit word comprises a plurality of subwords. In 720, a digest function is performed on each N bit word to produce, every clock cycle, a respective word digest for each N bit word using a digest circuit. The digest circuit operates by using a plurality of first circuits each to perform a first digest function on a respective subword of the plurality of subwords, in parallel, to produce a, plurality of subword digests wherein each first circuit operates within a single clock cycle to perform a function that is equivalent to shifting a respective subword through a linear feedback shift register (LFSR) having zero start state, using a plurality of second circuits, within a single clock cycle, to each perform a second digest function on a respective subword digest of the plurality of subword digests, the second digest function being equivalent to shifting the respective subword digest through the LFSR then followed by (I×M) zero bits, wherein I is related to a word position, within the N bit word, of a respective subword that generated the respective subword digest, and XORing outputs of the plurality of second circuits together along with a shifted prior LFSR state to produce the word digest of the N bit data word.

In 730, each N bit word along with an associated word digest is stored to the DUT using a storage circuit. In 740, an N bit word and associated word digest is read from the DUT. In 750, the method verifies that the N bit word is accurately stored on the DUT by analyzing the N bit word and the associated word digest. In 760, a result of the verifying is recorded.

Figure 8:
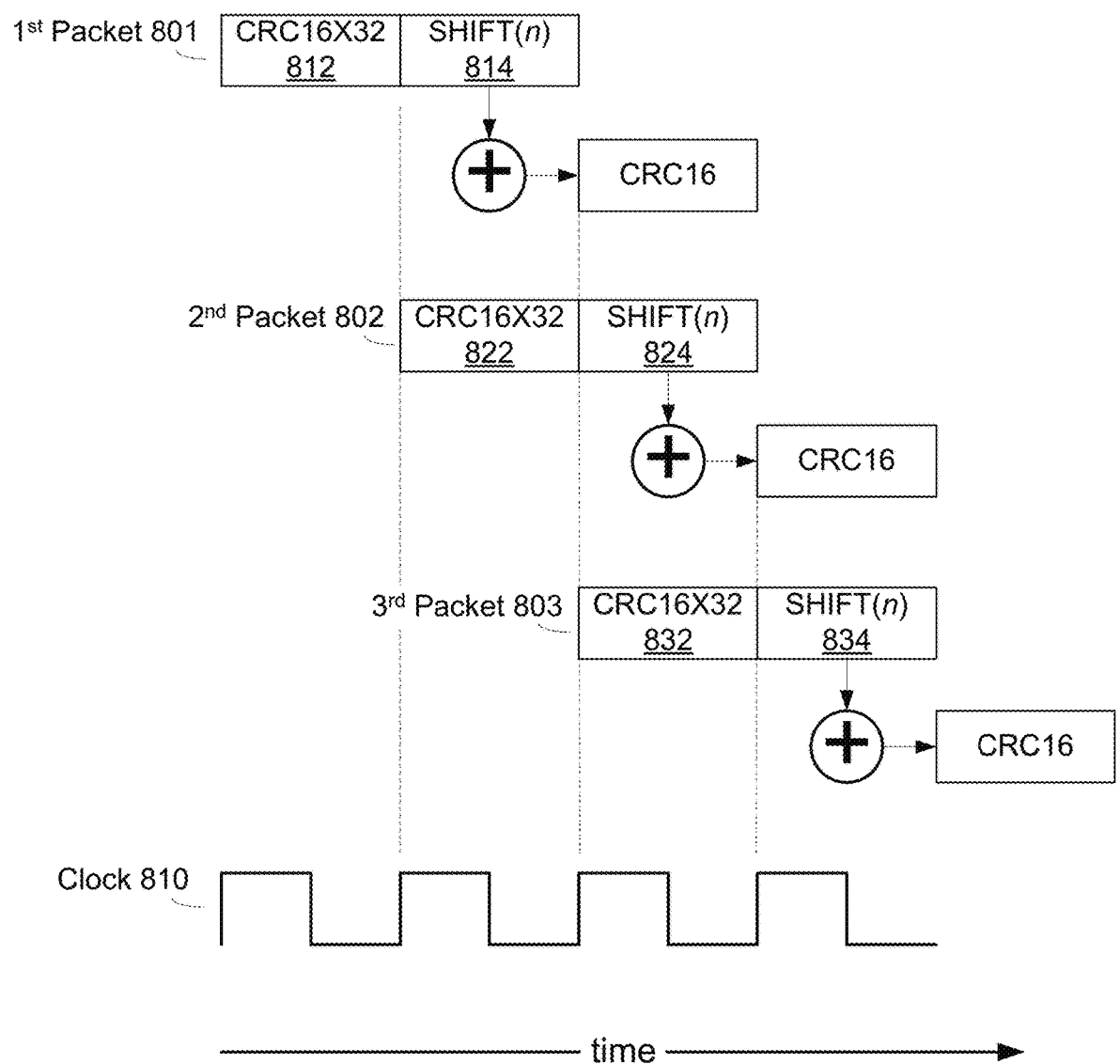
FIG. 8 illustrates an exemplary timing diagram of fast parallel CRC determination to support SSD testing, in accordance with embodiments of the present invention.

FIG. 8 illustrates an exemplary timing diagram 800 of fast parallel CRC determination to support SSD testing, in accordance with embodiments of the present invention. Timing diagram 800 illustrates a two-stage pipelined CEC determination. In a first cycle of clock 810, at 812, all 16-bit CRCs corresponding to all 32-bit sub-words of a 256-bit first input packet 801 are computed. This corresponds to the CRC16×32 logic stages 612 through 682 of FIG. 6.

In a second cycle of clock 810 at 814, all outputs corresponding to the first input packet 801 from the CRC16× 32 logic stages are shifted by the shift(n) logic stages 614 through 684. This corresponds to the shift(n) logic stages 614 through 684 of FIG. 6. The XORs, e.g., XORs 692 and 694 of FIG. 6, may occur within the same clock cycle as the shift(n) logic stages 614 through 684, producing a CRC16 for the entire first input packet 801 in two clock cycles. Also during the second cycle of clock 810, at 822, all 16-bit CRCs corresponding to all 32-bit sub-words of a 256-bit second input packet 802 are computed.

In a third cycle of clock 810 at 824, all outputs corresponding to the first input packet 801 from the CRC16×32 logic stages are shifted by the shift(n) logic stages 614 through 684. The XORs, e.g., XORs 692 and 694 of FIG. 6, may occur within the same clock cycle as the shift(n) logic stages 614 through 684, producing a CRC16 for the entire second input packet 802 in two clock cycles. Also during the third cycle of clock 810, at 832, all 16-bit CRCs corresponding to all 32-bit sub-words of a 256-bit second input packet 802 are computed.

In a fourth cycle of clock 810 at 824, all outputs corresponding to the first input packet 801 from the CRC16×32 logic stages are shifted by the shift(n) logic stages 614 through 684. The XORs, e.g., XORs 692 and 694 of FIG. 6, may occur within the same clock cycle as the shift(n) logic stages 614 through 684, producing a CRC16 for the entire third input packet 803 in two clock cycles. This process continues until all CRCs have been determined for all data, e.g., all data in an SSD sector.

Embodiments in accordance with the present invention provide systems and methods for fast parallel CRC determination to support SSD testing. In addition, embodiments in accordance with the present invention provide systems and methods for fast parallel CRC determination to support SSD testing that generate a CRC value for a 256-bit input packet in one clock cycle. Further, embodiments in accordance with the present invention provide systems and methods for fast parallel CRC determination to support SSD testing that are compatible and complementary with existing systems and methods of automated test environments.

Various embodiments of the invention are thus described. While the present invention has been described in particular embodiments, it should be appreciated that the invention should not be construed as limited by such embodiments, but rather construed according to the below claims.

What is claimed is:

1. A system used for testing memory storage devices, said system comprising:
    a test data pattern generator for generating test data for storage onto a memory storage device under test (DUT), wherein the generator is operable to generate, every clock cycle, a respective N bit word comprising a plurality of M bit subwords;
    a digest circuit operable to employ a digest function on each N bit word to produce, every clock cycle, a respective word digest for each N bit word; and a storage circuit operable to store each N bit word along with an associated word digest to the DUT, and wherein the digest circuit comprises:
  a plurality of first circuits each operable to perform a first digest function on a respective subword of the plurality of subwords, in parallel, to produce a plurality of subword digests;
  a plurality of second circuits each operable to perform a second digest function on a respective subword digest of the plurality of subword digests, the second digest function being equivalent to shifting said respective subword digest through a linear feedback shift register (LFSR) then followed by (I×M) zero bits, wherein I is related to a word position, within the N bit word, of a respective subword that generated the respective subword digest; and
  an XOR circuit operable to XOR outputs of said plurality of second circuits together along with a shifted prior LFSR state to produce the word digest of said N bit word.

2. A system as described in claim 1 wherein said digest function is a cyclic redundancy check (CRC16) function and wherein each of said plurality of first circuits are analogous and wherein each of said plurality of second circuits is different from the others.

3. A system as described in claim 2 wherein N is 256, the plurality of subwords is 8 and M is 32.

4. A system as described in claim 1 wherein said memory storage DUT is a Solid State Drive (SSD) device.

5. A system as described in claim 1 wherein the shifted prior LFSR state is equivalent to a word digest of a prior N bit word that is shifted by 8*M bits through the LFSR of said digest function.

6. A system as described in claim 1 wherein said digest circuit is pipelined with a latency of operation of two clock cycles and a throughput of one clock cycle and wherein further:
  said plurality of first circuits operate within one clock cycle to produce said plurality of subword digests and wherein further each first circuit of said plurality of first circuits is analogous to each other first circuit; and
  said plurality of second circuits operate within one clock cycle to produce said plurality of subword digests and wherein each second circuit of said plurality of second circuits is different from each other second circuit.

7. A system as described in claim 1 wherein the storage circuit is operable to store a respective N bit data word along with its associated word digest to the DUT every clock cycle.

8. An automated test environment (ATE) system used for testing solid state drives (SSDs), said system comprising:
  a test data pattern generator for generating test data at a rate of at least 8 Gbytes per second for storage onto an SSD under test (DUT), wherein the test data comprises a respective N bit word generated every clock cycle and comprising a plurality of 8 subwords;
  a pipelined digest circuit operable to employ a digest function on each N bit word to produce a respective word digest value for each N bit word every clock cycle; and
  a storage circuit operable to store each N bit word along with an associated word digest value to the DUT and wherein the pipelined digest circuit comprises:
    a plurality of first circuits each operable to perform a first digest function on a respective subword of the plurality of subwords, in parallel, to produce a plurality of subword digests wherein each first circuit operates within a first clock cycle and performs a function that is equivalent to shifting a respective subword through an LFSR having zero start state;
    a plurality of second circuits each operable, within a second clock cycle, to perform a second digest function on a respective subword digest of the plurality of subword digests, the second digest function being equivalent to shifting said respective subword digest through the LFSR then followed by (I×M) zero bits, wherein I is related to a word position, within the N bit word, of a respective subword that generated the respective subword digest; and
    an XOR circuit operable to XOR outputs of said plurality of second circuits together along with a shifted prior LFSR state to produce the word digest of said N bit data word.

9. The ATE system as described in claim 8 further comprising a data enable flag register that indicates which subwords of said N bit word are valid and wherein the pipelined digest circuit is further operable to input said data enable flag register and produce said word digest for an N bit word that is of a variable bit width.

10. The ATE system as described in claim 9 wherein said digest function is a cyclic redundancy check (CRC16) function.

11. The ATE system as described in claim 10 wherein N is 256 and M is 32 and wherein further:
  said plurality of first circuits operate within one clock cycle to produce said plurality of subword digests and wherein further each first circuit of said plurality of first circuits is analogous to each other first circuit; and
  said plurality of second circuits operate within one clock cycle to produce said plurality of subword digests and wherein each second circuit of said plurality of second circuits is different from each other second circuit.

12. The ATE system as described in claim 8 wherein the shifted prior LFSR state is equivalent to a word digest of a prior N bit word that is shifted by 8*M bits through the LFSR of said digest function.

13. The ATE system as described in claim 9 wherein said pipelined digest circuit has a latency of operation of two clock cycles and a throughput of one clock cycle.

14. The ATE system as described in claim 9 wherein the storage circuit is operable to store a respective N bit word along with its associated word digest to the DUT every clock cycle.

15. A method of testing memory storage devices, said method comprising:
  generating test data for storage onto a memory storage device under test (DUT) using a test data pattern generator, wherein the generating produces a respective N bit word every clock cycle and wherein the N bit word comprises a plurality of subwords;
  performing a digest function on each N bit word to produce, every clock cycle, a respective word digest for each N bit word using a digest circuit;
  storing each N bit word along with an associated word digest to the DUT using a storage circuit, wherein the digest circuit operates by:
    using a plurality of first circuits each to perform a first digest function on a respective subword of the plurality of subwords, in parallel, to produce a plurality of subword digests wherein each first circuit operates within a single clock cycle to perform a function that is equivalent to shifting a respective subword through a linear feedback shift register (LFSR) having zero start state;

using a plurality of second circuits, within a single clock cycle, to each perform a second digest function on a respective subword digest of the plurality of subword digests, the second digest function being equivalent to shifting said respective subword digest through the LFSR then followed by (I×M) zero bits, wherein I is related to a word position, within the N bit word, of a respective subword that generated the respective subword digest; and XORing outputs of said plurality of second circuits together along with a shifted prior LFSR state to produce the word digest of said N bit data word;

reading an N bit word and associated word digest from the DUT;

verifying that said N bit word is accurately stored on said DUT by analyzing said N bit word and said associated word digest; and recording a result of said verifying.

16. A method as described in claim 15 wherein said digest function is a cyclic redundancy check (CRC16) function and wherein N is 256 and the plurality of subwords is 8 subwords.

17. A method as described in claim 15 wherein said memory storage DUT is a Solid State Drive (SSD) device and wherein further the generating generates N bit words at a rate of 8 GBytes per second.

18. A method as described in claim 15 wherein the shifted prior LFSR state is equivalent to a word digest of a prior N bit word that is shifted by 8*M bits through the LFSR of said digest function.

19. A method as described in claim 15 wherein the storing is operable to store a respective N bit word along with its associated word digest to the DUT every clock cycle.

20. A method as described in claim 15 further comprising a data enable flag register that indicates which subwords of said N bit word are valid and wherein the digest circuit further performs:

inputting said data enable flag register for said N bit word; and producing said word digest for said N bit word based on said data enable flag register and wherein said N bit word is of variable bit width.

* * * * *